(12) United States Patent
Novak

(10) Patent No.: US 6,215,372 B1
(45) Date of Patent: Apr. 10, 2001

(54) METHOD AND APPARATUS FOR REDUCING ELECTRICAL RESONANCES IN POWER AND NOISE PROPAGATION IN POWER DISTRIBUTION CIRCUITS EMPLOYING PLANE CONDUCTORS

(75) Inventor: Istvan Novak, Maynard, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/324,407

(22) Filed: Jun. 2, 1999

(51) Int. Cl.[7] .................................................. H05K 1/18

(52) U.S. Cl. .............................. 333/12; 361/763; 361/794

(58) Field of Search .............................. 333/12; 361/738, 361/763, 766, 780, 793–795

(56) References Cited

U.S. PATENT DOCUMENTS

| 5,065,284 | * | 11/1991 | Hernandez ........................... 361/794 |
| 5,272,600 | * | 12/1993 | Carey ................................ 361/738 X |
| 5,926,377 | * | 7/1999 | Nakao et al. ....................... 333/12 X |
| 6,058,022 | * | 5/2000 | Gianni et al. ...................... 333/12 X |

OTHER PUBLICATIONS

Pannala, Sreemala, et al, "Contribution Of Resonance To Ground Bounce In Lossy Thin Film Planes", Proceedings of the 1998 7th Topical Meeting on the Electrical Performance of Electrical Packaging, Oct., 1998.

Franz, Joachim, et al., "An Approach To Determine Decoupling Effects Of VCC And VGG Structures In Multilayer Technique", Proceedings of the 1994 EMC Symposium, May 16–20, 1994, Sendai, Japan, pp. 56–59.

Bandyopadhyay, Jaya, et al., "Importance Of Damping And Resonance In Thin–Film Integrated Decoupling Capacitor Design", Proceedings of the 6th Topical Meeting on the Electrical Performance of Electrical Packaging, Oct. 27–29, 1997, pp. 31–34.

O'Sullivan, Cornelius B., "Developing A Decoupling Methodology With SPICE For Multilay Printed Circuit Boards", Proceedings of the 1998 International Symposium on Electromagnetic Compatibility, Aug., 1998, Denver, CO, pp. 562–565.

Lei, Guang–Tsai, et al., "Power Distribution Noise Suppression Using Transmission Line Termination Techniques", Proceedings of the 5th Topical Meeting on the Electrical Performance of Electrical Packaging, Oct. 28–30, 1996, pp. 100–102.

Lenihan, Timothy, et al., "Embedded Thin Film Resistors, Capacitors, And Inductors In Flexible Polyimide Films", The International Journal of Microcircuits and Electronic Packaging, vol. 20, 1997, No. 4 pp. 474–481.

* cited by examiner

*Primary Examiner*—Benny Lee
(74) *Attorney, Agent, or Firm*—Kudirka & Jobse, LLP

(57) ABSTRACT

Electrical resonances are reduced and noise propagation is attenuated in a multi-layer construction using planar power and ground planar conductors separated by insulating material by loading the power and ground planar conductors with a sufficient amount of capacitance, or series capacitance and resistance, at specific locations so that the planar conductors are electrically broken up into smaller sections which resonate at frequencies above the signal bandwidth. The propagation of injected noise is suppressed by the low-pass filter effect of the capacitive loading at the discrete locations. In accordance with one embodiment of the invention, islands of material with a dielectric constant higher than the dielectric constant of the overall insulator are placed at regular intervals where the capacitance of each high dielectric constant island is comparable to, or higher than, the capacitance of the "low" dielectric material which comprises the remainder of the insulating material. In accordance with a second embodiment, high dielectric constant islands are placed around power and ground vias where most of the transient charge capability is needed.

24 Claims, 8 Drawing Sheets

METHOD AND APPARATUS FOR REDUCING ELECTRICAL RESONANCES IN POWER AND NOISE PROPAGATION IN POWER DISTRIBUTION CIRCUITS EMPLOYING PLANE CONDUCTORS

FIELD OF THE INVENTION

This invention relates to electronic systems, and more particularly to electrical power distribution apparatus employing continuous planar conductors.

BACKGROUND OF THE INVENTION

Present day electronic and semiconductor integrated circuits are typically built on a multi-layer substrate or board which is used to interconnect the electronic components or devices which comprise the circuit. The multi-layer boards or substrates, in turn, consist of planar conductive layers separated by planar insulating layers. Portions of some of the conductive layers may be removed leaving electrically conductive signal lines or "traces" which connect the components on a particular layer. Conductive traces in different layers are typically electrically connected by forming holes in the intervening layers and plating the inside surfaces of the holes to form structures called "plated-through vias." Direct current power and ground are also provided to the components and devices in one or more of the layers.

Signals in digital electronic systems typically carry information by alternating between two voltage levels (i.e., a low voltage level and a high voltage level) so that a digital signal, over time, has an alternating voltage characteristic with an average frequency. Digital electronic systems are continually being produced which operate at higher and higher signal frequencies. The requirements of a power-distribution network which operates with high frequency circuits include a low impedance in the conductors from the power supply to the circuit over the frequency range at which the circuit operates and a low-pass filter-type transfer response which does not peak in the frequency range in which the circuit operates.

The low supply impedance is necessary because components and devices operating at high frequencies induce high frequency transient load currents in the conductors carrying power to the components. At the high frequencies present in the power conductors, any appreciable impedance can cause a significant drop in the voltage present at the component. The supply impedance usually has a design or target value which is calculated from the amount of noise generated by the electronics.

The requirement for low-pass type transfer impedance without peaking arises from the fact that DC power must be transmitted on the power-distribution network, but noise should not be transmitted. The bandwidth of such noise is usually equal to, or higher than, the bandwidth of signals that must be transmitted on the signal traces, so that the noise can be reduced by a low-pass type transfer impedance. In prior art analog circuits and digital electronics, the power-distribution network consisted of wires, metal bus bars, traces and bypass capacitors placed close to the electronic components and devices. This kind of structure inherently provides a low-pass characteristics, and the narrow-band nature of analog circuits and the low bandwidth of prior art digital systems ensured that the low-pass characteristics was present in spite of the fact that the equivalent series resistance (ESR) and the equivalent series inductance (ESL) values of the bypass capacitors were relatively high.

In modern electronic circuits, the target impedance is so low (typically in the milliohm range to up several hundred hundred megahertz frequencies), that it is not practical to rely on a power-distribution structure consisting of individual inductive components (inductors, wires, traces) and individual bypass capacitors to suppress noise. One prior art approach to produce a low target impedance is to utilize entire, unbroken planes in the multi-layer boards to deliver power and to provide ground. In addition, in order to increase the bypass capacitance between the signal traces and the power and ground planes, one approach in the prior art is to use a material with a high dielectric constant (Dielectric constant) in the insulating layer between the signal traces and the power and ground planes. The high dielectric constant material allows charge to be stored locally in the insulating material in order to provide a bypass capacitance function.

However, in order for electronic circuits to operate at high frequencies, the traces which carry digital signals from one component to another, called signal interconnects, must have a short propagation delay and have low signal losses at high frequencies. The signal propagation delay in a signal interconnect is primarily influenced by two factors: the interconnect length and the dielectric constant of the insulating material in the insulating layer between the signal interconnect and the power and ground plane. To make the propagation delay shorter, materials with a lower Dielectric constant must be used. Losses in the signal traces come from both the copper loss and dielectric loss and, to minimize the high-frequency losses, the dielectric constant of the insulating materials must also be low. However, the use of low dielectric constant materials reduces the locally available charge and, thus, conflicts with the noise reduction requirements of the power distribution network.

In addition, the use of insulating materials with the low dielectric loss together with the large planar power and ground layers create electrical resonators, and both the self and transfer impedances of such a structure exhibit an infinite number of resonance peaks at different locations in the structure. Consequently, the power supply impedance is increased at these peaks and noise can be transferred from one point to another with less attenuation and even amplified far from the noise source. For example, FIG. 1 is a perspective view of a pair of square conductive planes 100 and 102 separated by a dielectric layer 104 comprised of a fiberglass-epoxy composite material called FR4 which is in common use for constructing printed circuit boards. Each conductive plane has a side length (L) of 10 inches and is made of copper and is 0.0014 in. thick. The FR4 insulating layer separating the planes has a dielectric constant of about 4.7 and has a thickness (h) of 0.002 inches. FIG. 3 is a graph of the magnitude of the simulated electrical impedance between the pair of rectangular conductive planes of FIG. 1 ($\log_{10}$ scales) versus the frequency of a voltage between the planes ($\log_{10}$ scale). The graph illustrates the "self impedance" taken at three different locations: at the center of the structure (MSCntr), at one corner (MSCrn) and at the middle of one side (MSMidx.) The graph was created by modeling each of the pair of conductive planes as a grid of transmission line segments 200 connected at nodes 202 as illustrated in FIG. 2. The grid size was one inch and the impedance value was simulated by stepping a unity magnitude swept-frequency current source through all of the nodes 202 and calculating the voltages at all of the circuit nodes. The "self" impedance at any node is the complex voltage at the node while the current source is also at the same node. The transfer impedance between a first node and a second node is the complex voltage at the second node while the source is located at the first node.

As shown in FIG. 3, the magnitude of the self impedance between the parallel conductive planes 100 and 102 of FIG. 1 varies widely at frequencies above about 100 MHz. The parallel conductive planes exhibit multiple electrical resonances at frequencies between 100 MHz and 1 GHz, resulting in alternating high and low impedance values that affect the power supply impedance and noise transmission characteristics at these frequencies.

It would thus be desirable to have a system for power distribution which had no resonances within the bandwidth of the signals, had high attenuation for noise propagating between locations and had high charge reservoir capability to reduce power supply impedance without increasing the signal propagation delay.

SUMMARY OF THE INVENTION

In accordance with one illustrative embodiment of the invention, the foregoing objects are achieved by using capacitively loaded planar conductors in a multi-layer construction separated by insulating material with a relatively low dielectric constant. The power and ground planes are loaded with a sufficient amount of capacitance, or series capacitance and resistance, at specific locations so that the planar conductors are electrically broken up into smaller sections which resonate at frequencies above the signal bandwidth. The propagation of injected noise is suppressed by the low-pass filter effect of the capacitive loading at the discrete locations.

In accordance with one embodiment of the invention, islands of material with a dielectric constant higher than the dielectric constant of the overall insulator are placed at regular intervals where the capacitance of each high dielectric constant island is comparable to, or higher than, the capacitance of the "low" dielectric constant material which comprises the remainder of the insulating material. The spacing between islands is selected based on the signal frequency bandwidth involved.

In accordance with a second embodiment, high dielectric constant islands are placed around power and ground vias where most of the transient charge capability is needed. The placement of high dielectric constant islands is avoided in areas where signal carrying vias may cross the high dielectric constant islands.

In accordance with yet another embodiment, discrete capacitors, such as thin-film capacitors or embedded capacitors, can be placed on, or close to, the power and ground planes in the lamination at selected locations.

BRIEF DESCRIPTION OF THE DRAWINGS

The above and further advantages of the invention may be better understood by referring to the following description in conjunction with the accompanying drawings in which.

DETAILED DESCRIPTION

Figure 1:
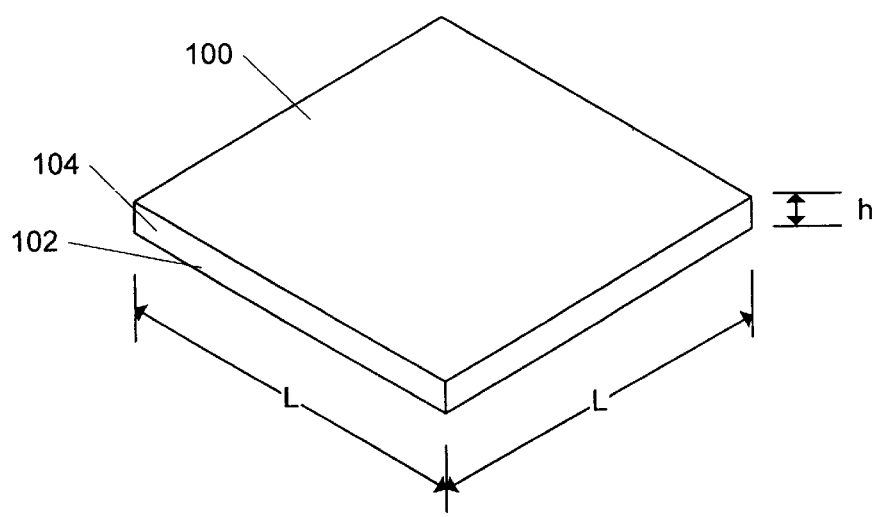
FIG. 1 is a perspective view of an electronic circuit substrate comprising two planar conductors separated by an insulating layer.
Figure 2:
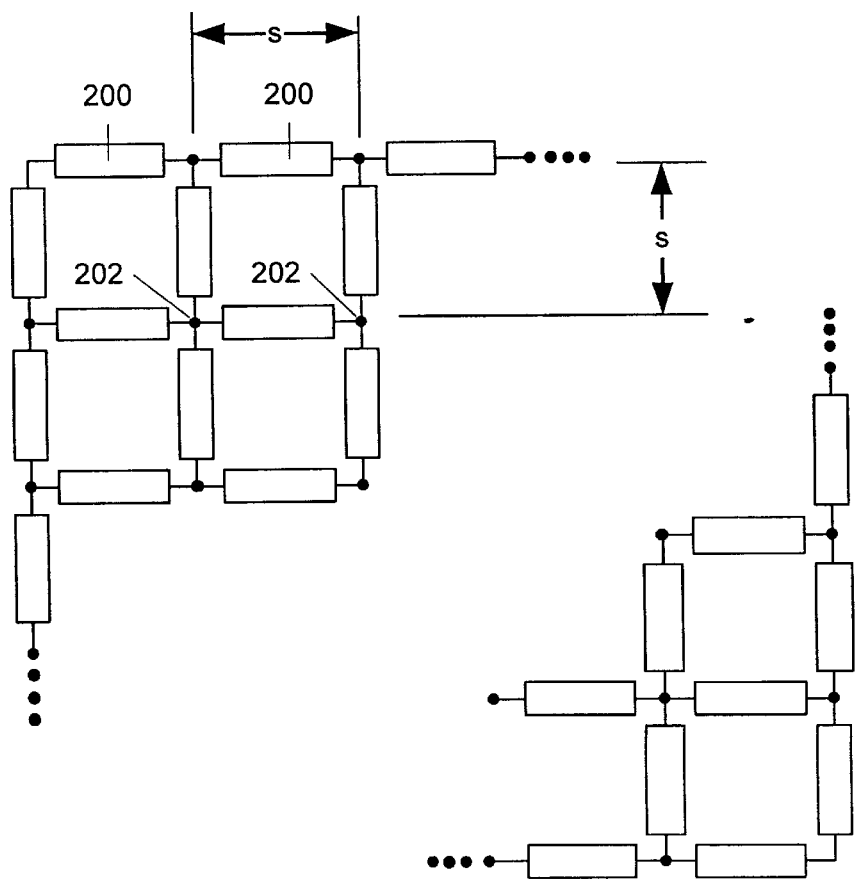
FIG. 2 is a grid of transmission lines used to model the circuit substrate shown in FIG. 1 for simulation purposes.

As previously mentioned, the structure illustrated in FIG. 1 can be modeled as a grid of transmission lines for simulation purposes as illustrated in FIG. 2. In order to simplify the model the transmission lines are assumed to be lossless transmission line segments 200 with ideal characteristics. However, transmission line segments which incorporate losses to account for resistive and skin losses in conductors and dielectric losses in dielectric layers can also be used by modifying the following equations in well-known ways.

The transmission line grid comprises a square mesh grid with transmission line segments connected together by nodes 202. The nodes are separated by an equivalent spacing distance s. The characteristics of ideal transmission lines 200 are determined by two equations which define the characteristic impedance and the propagation delay. The characteristic impedance "$Z_o$" of an ideal transmission line is defined by the following equation:

$$Z_o = \sqrt{\frac{L}{C}}$$

where L is the inductance of the transmission line per unit length and C is the capacitance per unit length. The propagation delay "$t_{pd}$" of the transmission line per unit length is defined by the following equation:

$$t_{pd} = \sqrt{LC}$$

where L and C are the same as above. Combining these equations gives:

$$Z_0 = \frac{t_{pd}}{C}$$

In a structure such as that shown in FIG. 1, the capacitance and propagation delay can be determined for a square unit cell with a side length s. The low frequency capacitance of each square s-by-s unit cell $C_u$ is given by the following equation:

$$C_u = \varepsilon_o \varepsilon_r \left( \frac{s^2}{h} \right)$$

where $\epsilon_o$ is the dielectric constant of air and $\epsilon_r$ is the relative dielectric constant of the insulating material separating the planar conductors. The propagation delay $t_{pdu}$ along a side s of the unit cell is given by:

$$t_{pdu} = s/c \sqrt{\varepsilon_r}$$

where c is the speed of light in a vacuum (approximately $3 \times 10^8$ meters per second.) Therefore, an approximate low frequency characteristic impedance $Z_{ou}$ of each s-by-s square unit cell is given by:

$$Z_{ou} = \frac{t_{pdu}}{C_u} = \left( \frac{s\sqrt{\varepsilon_r}}{c} \right) \left( \frac{h}{\varepsilon_o \varepsilon_r s^2} \right) = \frac{h}{c \varepsilon_o s \sqrt{\varepsilon_r}} = Z_{oo} \left( \frac{h}{s\sqrt{\varepsilon_r}} \right)$$

where $Z_{oo}$ is the impedance of free space, $120\pi$ ohms.

In the grid illustrated in FIG. 2, each square s-by-s grid cell is represented by four transmission line segments 200, one along each side of the unit cell. Therefore, each transmission line segment 200 must have a characteristic impedance of $4 \cdot Z_{ou}$ in order for the overall impedance to be $Z_{ou}$. Transmission line segments 200 of adjacent cells are in parallel, resulting in equivalent characteristic impedances of $2 \cdot Z_{ou}$ and transmission line segments at the outer edges of the structure have characteristic impedances of $4 Z_{ou}$. All transmission line segments 200 have a propagation time delay of $t_{pdu}$. With a structure incorporating FR4 insulating material, $\epsilon_r$=4.7 and s was taken as 1 inch and h as 0.002 inches. This gives a characteristic unit cell impedance of:

$$Z_{ou} = Z_{oo} \left( \frac{h}{s\sqrt{\varepsilon_r}} \right) = 120\pi\Omega \left( \frac{0.002}{\sqrt{4.7}} \right) = 0.35\Omega$$

Figure 3:
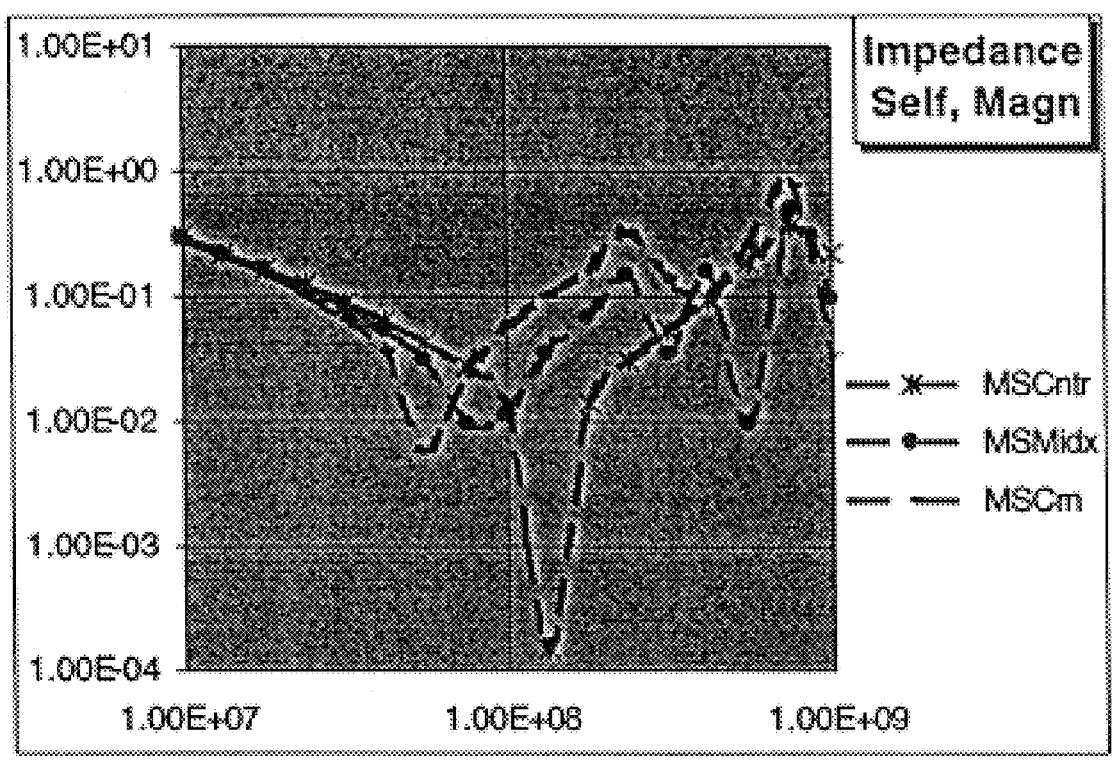
FIG. 3 is a graph of the magnitude of the simulated self impedance at three different locations on the structure illustrated in FIG. 1 versus the frequency of the applied current source.

This value was used for the simulation which generated the graph illustrated in FIG. 3.

Figure 4:
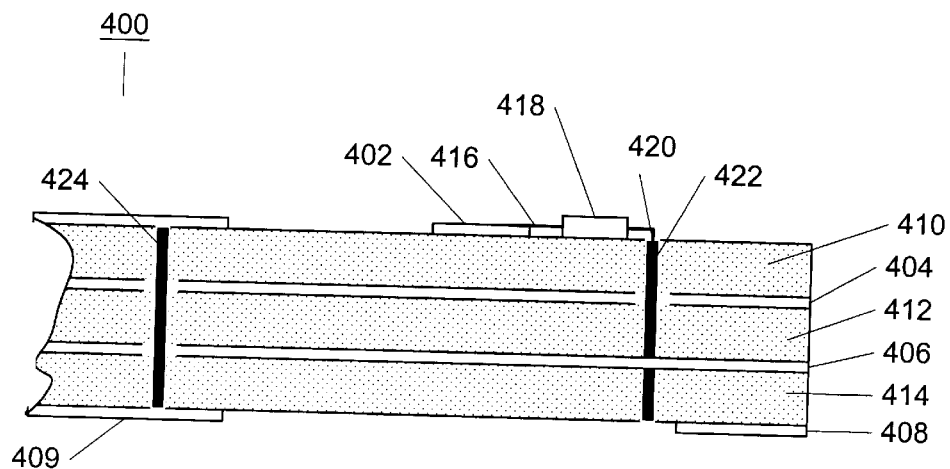
FIG. 4 is a cross-sectional diagram of a multi-layer substrate incorporating a signal and a power via.

FIG. 4 is a cross-sectional view of a portion of a multi-layer electronic substrate 400. In the substrate illustrated in FIG. 4, there are four planar electrical conductors: a first signal planar conductor 402, a ground planar conductor 404, a power planar conductor 406, and a second signal planar conductor 408. The power planar conductor 406 is connected to a power terminal of an electrical power supply, and the ground planar conductor 404 is connected to a ground terminal of the power supply. Electronic devices are connected between power planar conductor 406 and ground planar conductor 404 to receive electrical power. The first signal planar conductor 402 and the ground planar conductor 404 are separated by a first dielectric layer 410. Similarly, the ground planar conductor 404 and the power planar conductor 406 are separated by a second dielectric layer 412. Finally, the power planar conductor 406 and second signal plane 408 are separated by a third dielectric layer 414. The substrate 400 may have more layers or less layers than what are illustrated in FIG. 4 without affecting the operation of the invention.

In order to reduce the power supply impedance, the power planar conductor 406 and the ground planar conductor 404 are continuous across at least a portion of substrate 400. However, the first signal planar conductor 412 and the second signal planar conductor 408 may be etched to form electrically conductive traces as described above.

Electrical components 418 can be connected to the traces 402 by leads 416 as illustrated in FIG. 4. In addition, component 418 can be connected, for example to the power planar conductor 406 by means of lead 420 to a plated-through via 422, which connects to the power planar conductor 406. Via 422 is formed by means of a number of well-known processes.

If, in accordance with prior art teachings, the dielectric constant of dielectric layer 412 is increased in order to reduce the power supply impedance and increase charge storage in the dielectric layer, the increased charge capacity in the area surrounding power via 422 reduces noise. However, the increased dielectric constant in the area of signal carrying via 424 capacitively loads the signal trace where it passes through the high dielectric constant layer 412, increases the signal propagation time and creates distortion. Moreover, because of the lower propagation speeds, the high dielectric constant layer 412 reduces the resonance frequencies in the planar conductors 404 and 406 making it more likely that the resonant frequencies will lie within the signal bandwidth. In addition, attenuation of noise between distant locations is not altered by higher dielectric constant. Also high dielectric constant materials tend to be brittle and harder to process in lamination when entire solid layers are required.

As previously mentioned, in accordance with the principles of the invention, relatively low dielectric constant materials are used in the insulating layer 412, but the power and ground planar conductors 404 and 406 are loaded with a sufficient amount of capacitance, or series capacitance and resistance, at specific locations so that the planar conductors 404 and 406 are electrically broken up into smaller sections which resonate at frequencies above the signal bandwidth. The propagation of injected noise is suppressed by the low-pass filter effect of the capacitive loading at the discrete locations.

In accordance with one embodiment, the core laminate 412 is comprised of a low-dielectric constant material such as the FR4 material previously discussed. "Islands" of high dielectric constant material are dispersed in the low dielectric constant material at regular intervals. The capacitance of each island is designed to be comparable to, or higher than, the capacitance of the low dielectric constant area around the island, and the separation between adjacent islands is selected according to the highest frequency components.

The effect of adding these isolated capacitors is illustrated in FIGS. 5A–5F. These figures are graphs of the magnitude of the simulated self electrical impedance between the pair of rectangular conductive planes of FIG. 1 ($\log_{10}$ scales) versus the frequency of a voltage between the planes ($\log_{10}$ scale) with capacitive loading of the plates. Each graph illustrates the "self impedance" taken at three different locations: at the center of the structure (MSCntr), at one corner (MSCrn) and at the middle of one side (MSMidx.) The graphs were created by modeling each of the pair of conductive planes as a grid of transmission line segments 200 connected at nodes 202 as illustrated in FIG. 2 and loading the grid at every node 202 with the same amount of capacitance. The value of the capacitance was stepped through the following values: 1500 pF, 500 pF, 15 nF, 50 nF, 150 nF and 500 nF in order to generate FIGS. 5A–5F. All capacitors were assumed to have the same ESR=0.01 ohms and the same ESL=10 pH which corresponds to capacitors connected directly to the planes without vias. The grid size (s) was one inch and the impedance value was simulated by stepping a unity magnitude swept-frequency current source through all of the nodes 202 and calculating the voltages at all of the circuit nodes 202.

As indicated in FIGS. 5A–5F, there is an improvement in the response corresponding to a reduction in the peak magnitudes which begins at capacitance values of about 150 nF and increases at higher capacitance values.

Figure 6:
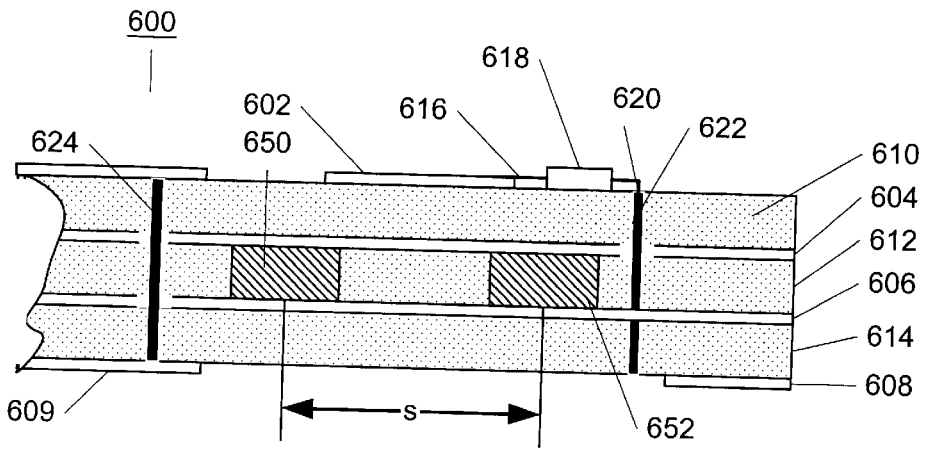
FIG. 6 is a cross-sectional diagram of a multi-layer substrate incorporating uniformly spaced high dielectric constant islands in accordance with the principles of the invention.

FIG. 6 is a cross-sectional view of a portion of a multi-layer electronic substrate 600 which corresponds to the structure illustrated in FIG. 4, but incorporates capacitive islands in accordance with the first inventive embodiment. Elements in FIG. 6 which correspond to elements in FIG. 4 have been given corresponding numeral designations. For example, in the substrate illustrated in FIG. 6, there are four planar electrical conductors: a first signal planar conductor 602, a ground planar conductor 604, a power planar conductor 606, and a second signal planar conductor 608. These conductors correspond to the four planar conductors 402, 404, 406 and 408 illustrated in FIG. 4. FIG. 6 also illustrates the capacitive islands 650 and 652 which are spaced at a distance s and capacitively load the power and ground planar conductors 604 and 606.

Figure 7:
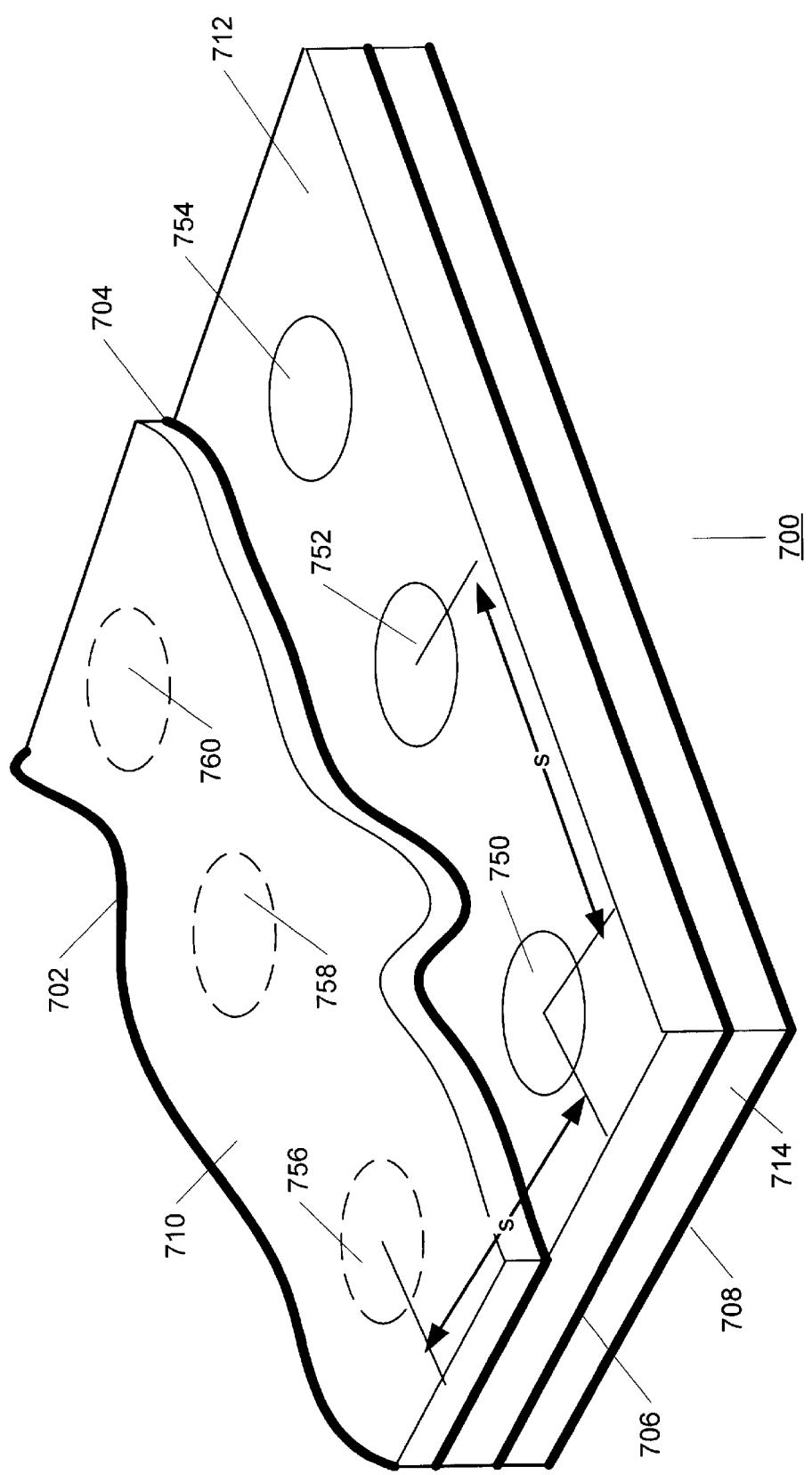
FIG. 7 is a perspective view of a multi-layer substrate incorporating uniformly spaced high dielectric constant islands in accordance with the principles of the invention.

A perspective view of the same structure is illustrated in FIG. 7. As with FIGS. 4 and 6, corresponding elements have corresponding numeral designations. In FIG. 7, portions of the upper signal planar conductor 702, the insulating layer 710 and ground planar conductor 704 have been removed to expose the capacitive islands 750, 752 and 754. Additional capacitive islands 756, 758 and 760 are illustrated in phantom. The islands 750–760 are spaced in a regular grid with a spacing of s as illustrated in FIGS. 6 and 7. Although circular islands are illustrated, other shapes, such as squares or rectangles can also be used.

The islands 750–760 are comprised of insulating material with a dielectric constant that is higher than that of the surrounding material 712. The dielectric constant of islands 750–760 may be increased by suspending particulates of a substance having a relatively high dielectric constant (e.g., titanium dioxide or barium titanate) within a dielectric binder material (e.g., epoxy resin polytetrafluoroethylene, or polystyrene). The dielectric constant of the particulate-binder combination may be varied by changing the number of particulates per unit volume of the particulate-binder combination. Increasing the number of suspended particulates per unit volume of the particulate-binder combination increases the dielectric constant of the particulate-binder combination. Decreasing the number of suspended particulates per unit volume of the particulate-binder combination decreases the dielectric constant of the particulate-binder combination. In one embodiment, islands of high dielectric material are inserted into cutouts in the base material 712. In another embodiment, the base material 712 is prepared with the islands formed in place by varying the particulate-binder combination during manufacture of the insulating material.

Alternatively, the dielectric constant of the insulating material 712 can be selectively increased by applying coatings to the base material 712 in the island areas 750–760 in order to vary the dielectric constant. Such coatings can be applied by conventional screen printing techniques such as those used to manufacture thin film capacitors and resistors.

As previously mentioned, the power and ground planes are loaded with a sufficient amount of capacitance, or series capacitance and resistance, at specific locations so that the planar conductors are electrically broken up into smaller sections which resonate at frequencies above the signal bandwidth. Accordingly, the spacing s is related to the maximum signal frequency in the signal frequency bandwidth. In particular, the wavelength of signals generated by the resonating sections should be substantially shorter than the shortest wavelength in the signal bandwidth, for example, one tenth of the shortest signal wavelength or $$s = \frac{\lambda_s}{10}.$$

In a typical application, the signal bandwidth is from d.c. to approximately 300 MHz. The shortest wavelength, $\lambda_s$, corresponding to the maximum frequency is equal to the wave velocity divided by the maximum frequency, $f_m$. In a material having a relative dielectric constant of $\epsilon_r$ the wave velocity is the speed of light in a vacuum, c, divided by the square root of the dielectric constant. Thus, the shortest wavelength is given by $$\lambda_s = \frac{c}{f_m \sqrt{\epsilon_r}}$$

and the spacings is given by:

$$s \leq \frac{c}{10 f_m \sqrt{\epsilon_r}}$$

Assuming each high dielectric constant island loads or "serves" a unit cell in which it is located, the low frequency capacitance of a square s-by-s unit cell $C_u$ is given by the aforementioned equation:

$$C_u = \varepsilon_o \varepsilon_r \left( \frac{s^2}{h} \right)$$

where $\epsilon_o$ is the dielectric constant of air and $\epsilon_r$ is the relative dielectric constant of the insulating material separating the planar conductors. Therefore, the capacitance of a high dielectric island, C, should be greater than the plate capacitance of the cell served by the island or:

$$C \geq \varepsilon_0 \varepsilon_r \left( \frac{s^2}{h} \right)$$

Figure 8:
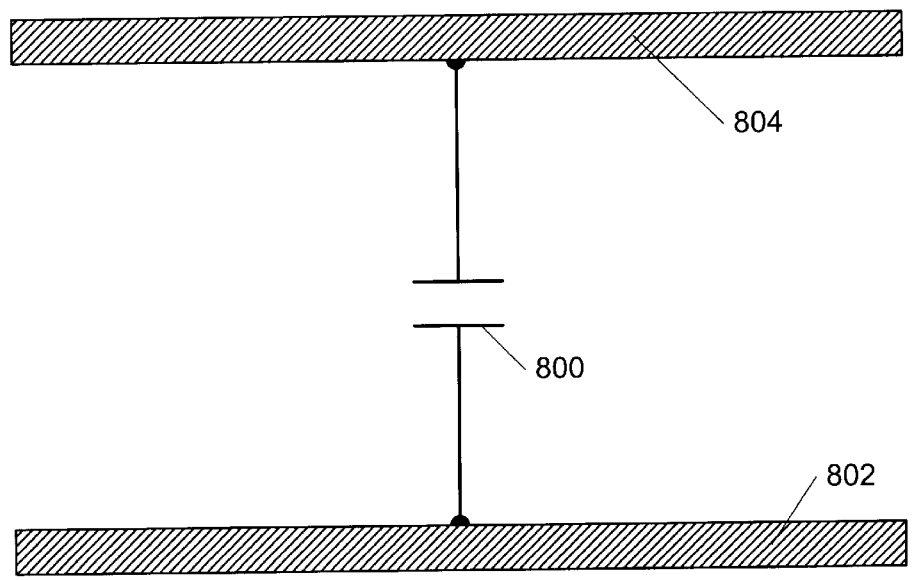
FIG. 8 is a schematic diagram of a capacitor which is equivalent to the capacitance of a high dielectric constant island.

If a simple capacitor 800 is placed between the ground plane 804 and the power plane 806 as indicated in FIG. 8, then the value of C is chosen according to the preceding formula and the resistance of the island is the effective series resistance (ESR) of the capacitive island.

Figure 9:
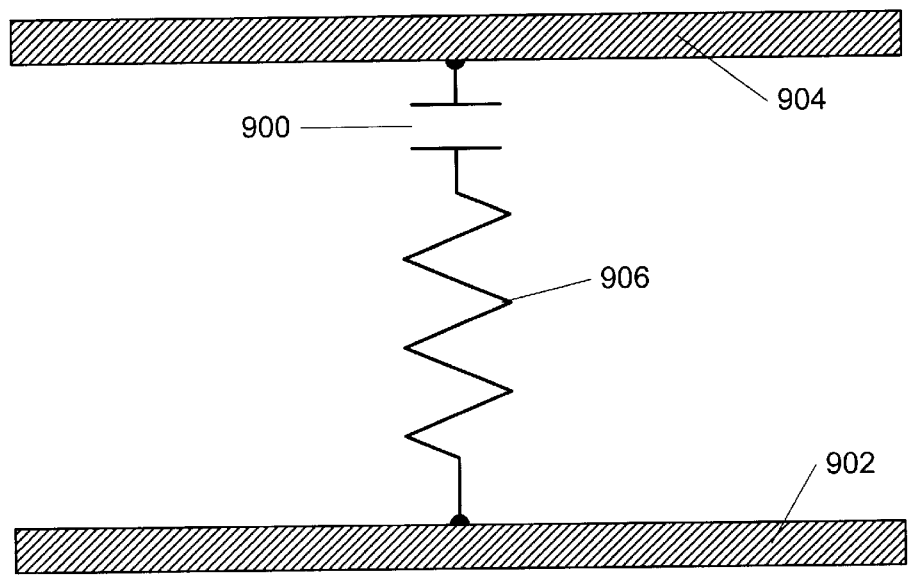
FIG. 9 is a schematic diagram of a series capacitor and resistor which are equivalent to the capacitance of a high dielectric constant island combined with a resistor or which are equivalent to the capacitance of a high dielectric constant island and its effective series resistance (ESR.)

Alternatively, an additional resistor 906 can be added in series with the capacitor 900 between the ground plane 902 and the power plane 904 as illustrated in FIG. 9. The value of this resistor can be selected to be equal to the characteristic impedance per unit cell:

$$Z_{ou} = Z_{oo}\left(\frac{h}{s\sqrt{\varepsilon_r}}\right)$$

This resistor can be fabricated by suspending particulates of an electrically conductive substance, such as silver, copper or nickel particles, within an insulating binder material (e.g., epoxy resin polytetrafluoroethylene, or polystyrene) in the high dielectric island. The resistivity of the particulate-binder combination may be varied by changing the number of particulates per unit volume of the particulate-binder combination. Increasing the number of suspended particulates per unit volume of the particulate-binder combination increases the resistivity of the particulate-binder combination, while decreasing the number of suspended particulates per unit volume of the particulate-binder combination decreases the resistivity of the particulate-binder combination. Alternatively, a resistor can be fabricated by applying a resistive coating using conventional screening or printing techniques.

Although the configuration illustrated in FIGS. 6 and 7 has improved noise rejection and suppressed resonances, this embodiment is prone to capacitive loading of signal traces if a signal via happens to pass through a high dielectric constant island. This problem can be minimized by increasing the ratio of the high dielectric constant in the islands to the lower dielectric constant in the remainder of the insulating layer. By increasing the dielectric constant ratio, the same effective low-pass filtering can be achieved by using smaller portions of the areas surrounding each high dielectric constant island.

Figure 10:
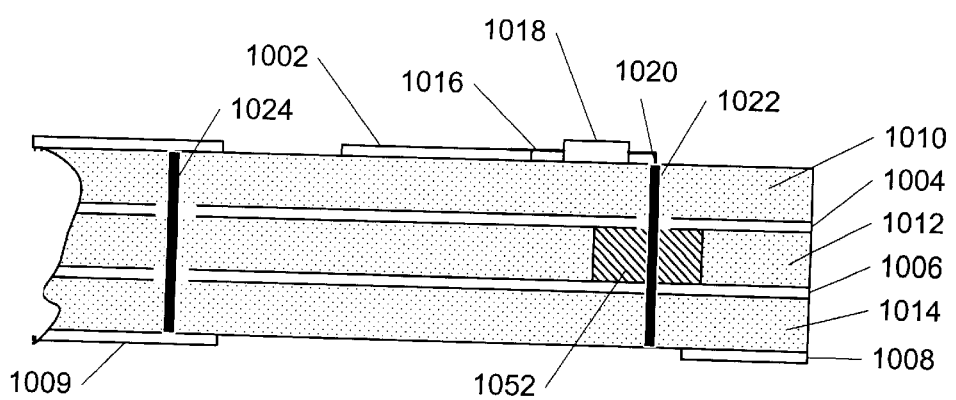
FIG. 10 is a cross-sectional diagram of a multi-layer substrate incorporating high dielectric constant islands located around power and ground vias in accordance with the principles of the invention.
Figure 5A:
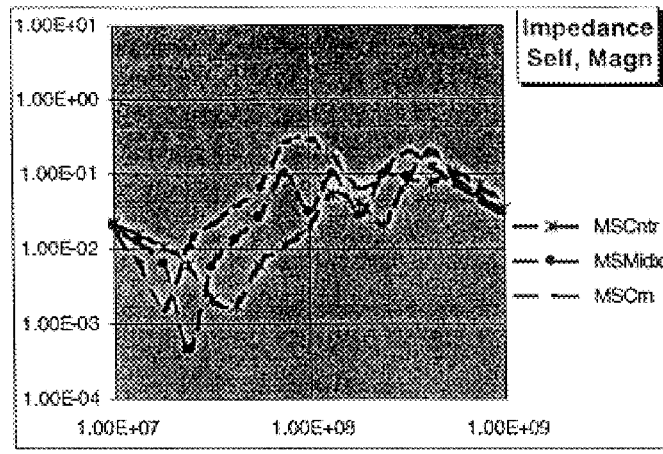
FIGS. 5A–5F are graphs of the magnitude of the simulated self impedance at three different locations on the structure illustrated in FIG. 1 versus the frequency of the applied current source for an embodiment which has been uniformly loaded with various values of capacitance. Each graph represents a different value of the loading capacitance.
Figure 5B:
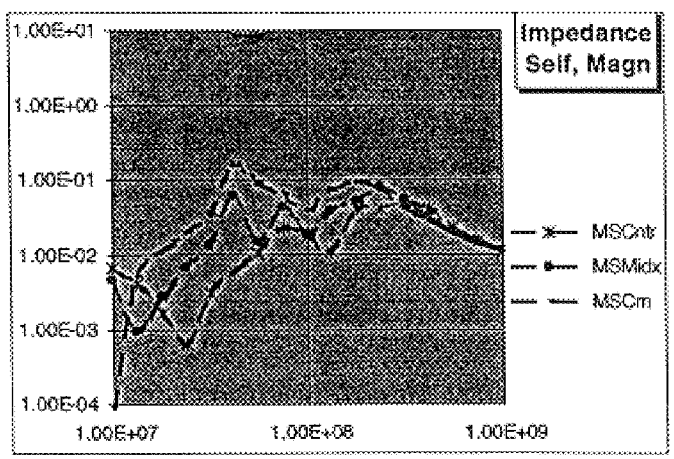
Figure 5C:
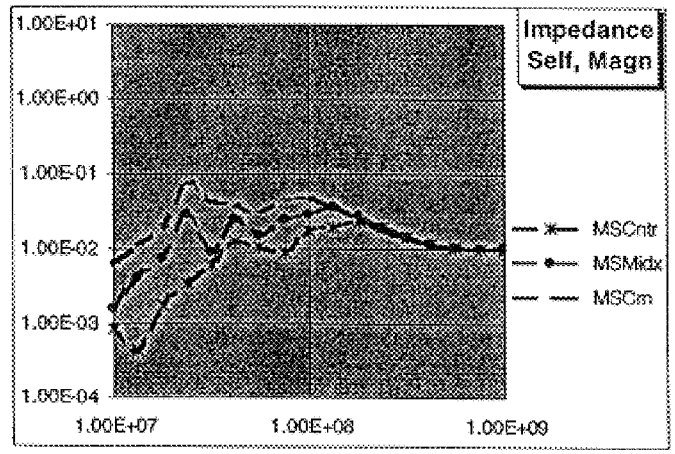
Figure 5D:
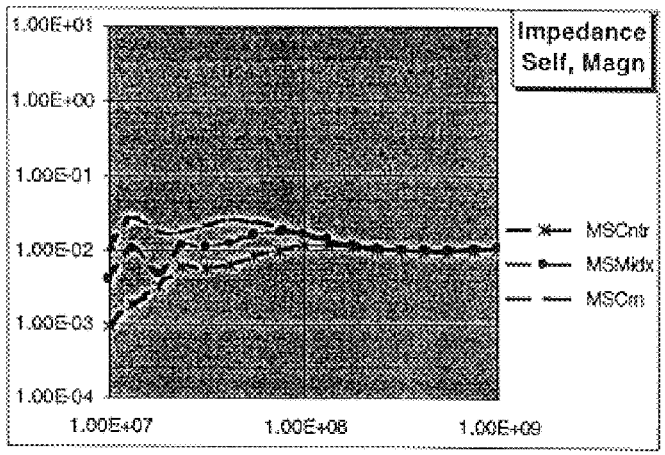
Figure 5E:
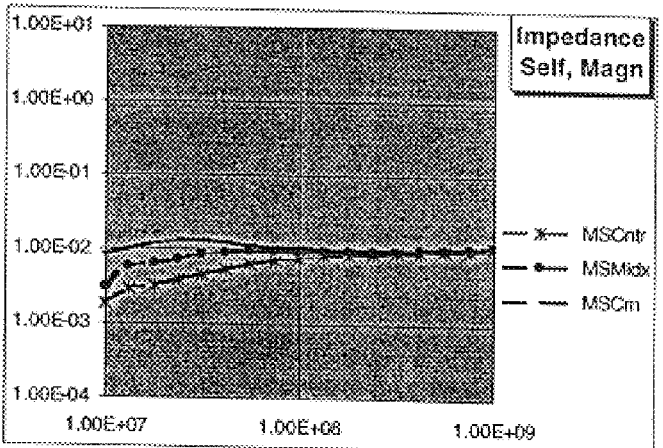
Figure 5F:
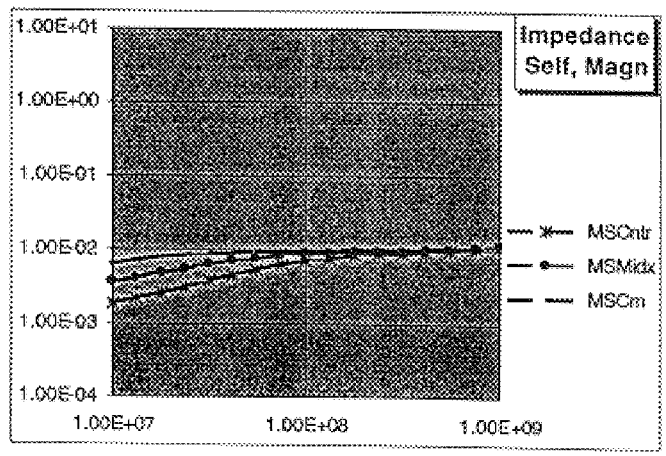
Figure 11:
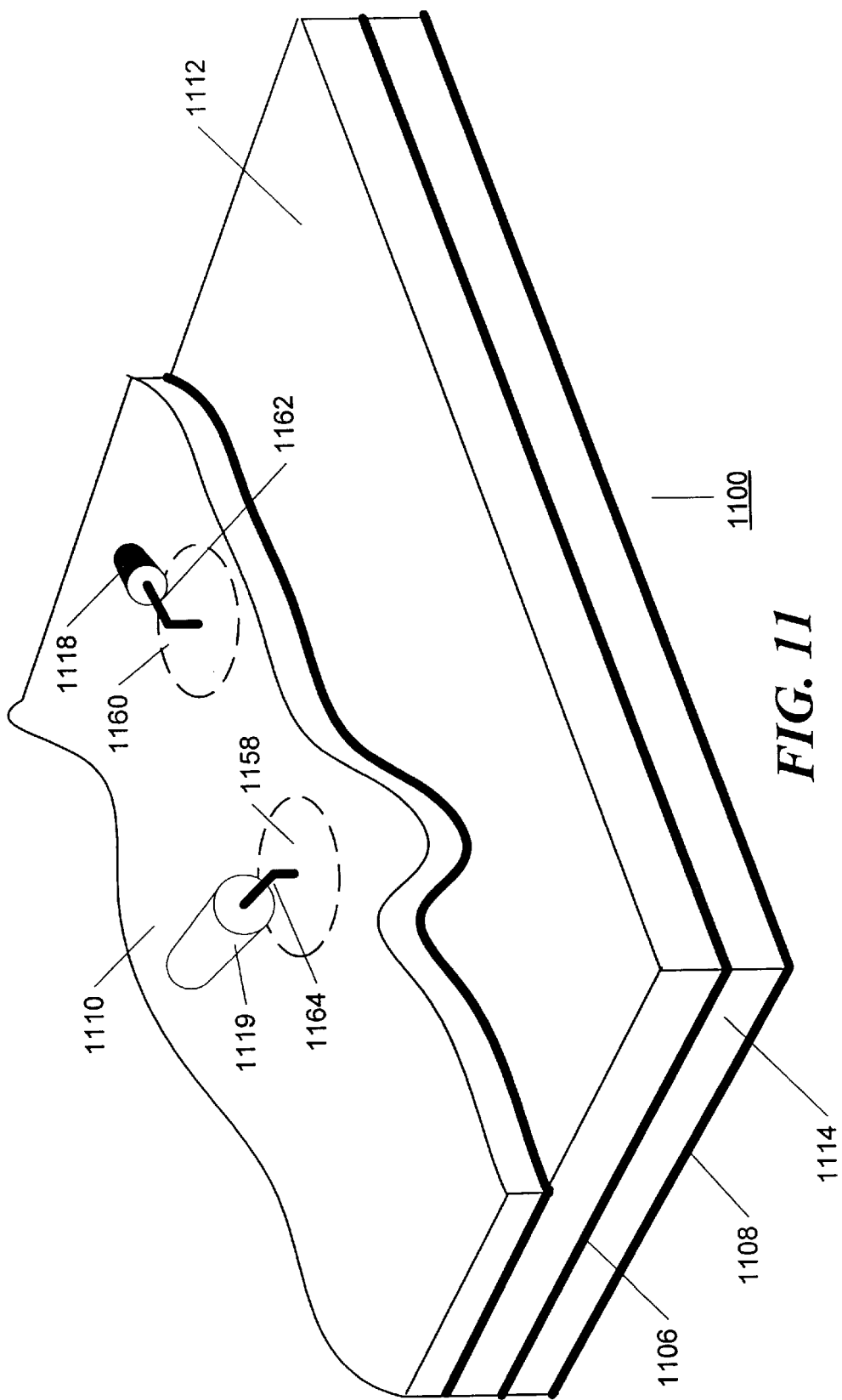
FIG. 11 is a perspective view of a multi-layer substrate incorporating high dielectric constant islands located around power and ground vias in accordance with the principles of the invention.

An alternative embodiment avoids the problems of signal vias passing through high dielectric constant islands by placing the high dielectric constant islands only around power and ground vias, where most of the transient charge is needed and avoiding areas where signal vias may cross the high dielectric constant island. For this embodiment, the high dielectric constant islands can be formed by selective integrated passive technologies, such as screened/printed high dielectric constant islands, selective placement or lamination of thin-film capacitors or embedded discrete capacitors on or close to the power ground planes, but located in the lamination. This embodiment is illustrated in FIGS. 10 and 11 which show a cross-sectional view of the substrate and a perspective view, respectively. FIG. 10 which is similar to FIGS. 4 and 6 and has corresponding numeral designations, illustrates a high dielectric constant island 1052 surrounding a power via 1022 connected to component 1018.

Like FIG. 7, FIG. 11 has portions of several layers removed to expose portions of the insulating layer. FIG. 11 illustrates two components 1118 and 1119 which are connected by leads 1162 and 1164 to power and ground vias passing through high dielectric constant islands 1158 and 1160.

The embodiment shown in FIGS. 10 and 11 possesses the advantage that it can be used to construct a uniform laminate material in which the values of the resistances and capacitances used in the high dielectric constant islands do not depend on the finished size of the substrate.

Although exemplary embodiments of the invention have been disclosed, it will be apparent to those skilled in the art that various changes and modifications can be made which will achieve some of the advantages of the invention without departing from the spirit and scope of the invention. For example, it will be obvious to those reasonably skilled in the art that, although the description was directed to particular substrate configurations, other substrate configurations could be used in the same manner as that described. Other aspects, such as the shapes of the high dielectric constant islands other than those disclosed which achieve the same function, as well as other modifications to the inventive concept are intended to be covered by the appended claims.

What is claimed is:

1. Apparatus for reducing electrical resonances and attenuating propagation noise in a power distribution circuit employing a planar power conductor and a planar ground conductor, the apparatus comprising:

a layer of insulating material separating the planar power conductor and the planar around conductor, the insulating material having a first dielectric constant; and a plurality of isolated islands formed of insulating material having a second dielectric constant higher than the first dielectric constant dispersed uniformly through the insulating material layer with a spacing s where $$s \leq \frac{c}{10 f_m \sqrt{\varepsilon_r}}$$

where c is the speed of light in a vacuum, $f_m$ is the maximum frequency in a frequency band of interest and $\varepsilon_r$ is the first dielectric constant.

2. The apparatus as recited in claim 1 wherein the insulating material forming the plurality of islands comprises particles of material with a third dielectric constant suspended in an insulating material having the first dielectric constant to form a material with the second dielectric constant.

3. The apparatus as recited in claim 1 wherein the insulating material forming the plurality of islands comprises an insulating material having the first dielectric constant which is coated with a material having a third dielectric constant to form a material with the second dielectric constant.

4. The apparatus as recited in claim 1 wherein the power distribution circuit includes power and ground vias which are connected to the power plane conductor and the ground plane conductor and pass through the insulating material layer and wherein plurality of isolated islands are dispersed around the power and ground vias.

5. The apparatus as recited in claim 1 wherein the isolated islands form capacitors connecting the planar power conductor and the planar ground conductor and wherein the second dielectric constant is selected so that each of the plurality of islands produces a capacitor having a capacitance value $$C \geq \varepsilon_0 \varepsilon_r \left(\frac{s^2}{h}\right)$$

where $\varepsilon_o$ is the dielectric constant of air and $\varepsilon_r$ is the first dielectric constant, h is the thickness of the insulating material layer and s is a spacing between the plurality of isolated islands.

6. Apparatus for reducing electrical resonances and attenuating propagation noise in a power distribution circuit employing a planar power conductor and a planar ground conductor, the apparatus comprising:

a layer of insulating material separating the planar power conductor and the planar ground conductor, the insulating material having a first dielectric constant; and a plurality of isolated islands formed of insulating material having a second dielectric constant higher than the first dielectric constant dispersed through the insulating material layer and comprising a resistive material.

7. The apparatus as recited in claim 6 wherein the plurality of isolated islands are dispersed uniformly through the insulating material layer with a spacing s and wherein the resistance has a value equivalent to $$Z_{\infty}\left(\frac{h}{s\sqrt{\varepsilon_r}}\right)$$

where $Z_{oo}$ is the characteristic impedance of free space, and $\varepsilon_r$ is the value of the first dielectric constant.

8. The apparatus as recited in claim 6 wherein the resistive material comprises electrically conductive particles dispersed in an insulating binder in the insulating material forming the plurality of islands.

9. The apparatus as recited in claim 6 wherein the resistive material comprises a coating on the insulating material layer.

10. The apparatus as recited in claim 6 wherein the resistance has a value equivalent to a characteristic impedance of a unit cell in the insulating material layer.

11. The apparatus as recited in claim 6 wherein the isolated islands form capacitors connecting the planar power conductor and the planar ground conductor and the resistive material forms a resistor connected in series with the capacitors.

12. The apparatus as recited in claim 11 wherein the second dielectric constant is selected so that each of the plurality of islands produces a capacitor having a capacitance value $$C \geq \varepsilon_0 \varepsilon_r \left(\frac{s^2}{h}\right)$$

where $\varepsilon_o$ is the dielectric constant of air and $\varepsilon_r$ is the first dielectric constant, h is the thickness of the insulating material layer and s is a spacing between the plurality of isolated islands.

13. A method for reducing electrical resonances and attenuating propagation noise in a power distribution circuit employing a planar power conductor and a planar ground conductor, the method comprising:
(a) inserting a layer of insulating material between the planar power conductor and the planar ground conductor, the insulating material having a first dielectric constant; and
(b) forming a plurality of isolated islands of insulating material having a second dielectric constant higher than the first dielectric constant, the islands being dispersed uniformly through the insulating material layer with a spacing s where $$s \leq \frac{c}{10 f_m \sqrt{\varepsilon_r}}$$

where c is the speed of light in a vacuum, $f_m$ is the maximum frequency in a frequency band of interest and $\varepsilon_r$ is the first dielectric constant.

14. The method as recited in claim 13 wherein (b) comprises forming the plurality of islands with an insulating material having the first dielectric constant which is coated with a material having a third dielectric constant to form a material with the second dielectric constant.

15. The method as recited in claim 13 wherein the isolated islands form capacitors connecting the planar power conductor and the planar ground conductor and wherein (b) comprises selecting the second dielectric constant so that each of the plurality of islands produces a capacitor having a capacitance value $$C \geq \varepsilon_0 \varepsilon_r \left(\frac{s^2}{h}\right)$$

where $\varepsilon_o$ is the dielectric constant of air and $\varepsilon_r$ is the first dielectric constant, h is the thickness of the insulating material layer and s is a spacing between the plurality of isolated islands.

16. The method as recited in claim 13 wherein (b) comprises forming the plurality of islands with particles of material with a third dielectric constant suspended in an insulating material having the first dielectric constant to form a material with the second dielectric constant.

17. The method as recited in claim 13 wherein the power distribution circuit includes power and ground vias which are connected to the power plane conductor and the ground plane conductor and pass through the insulating material layer and wherein (b) comprises dispersing the plurality of isolated islands around the power and ground vias.

18. A method for reducing electrical resonances and attenuating propagation noise in a power distribution circuit employing a planar power conductor and a planar ground conductor, the method comprising:
(a) inserting a layer of insulating material between the planar power conductor and the planar ground conductor, the insulating material having a first dielectric constant; and
(b) forming a plurality of isolated islands of insulating material having a second dielectric constant higher than the first dielectric constant dispersed through the insulating material layer, the plurality of isolated islands being formed of a resistive material.

19. The method as recited in claim 18 wherein the isolated islands form capacitors connecting the planar power conductor and the planar ground conductor and the resistive material forms a resistor connected in series with the capacitors.

20. The method as recited in claim 19 wherein the plurality of isolated islands are dispersed uniformly through the insulating material layer with a spacing s and wherein the resistance has a value equivalent to $$Z_{\infty}\left(\frac{h}{s\sqrt{\varepsilon_r}}\right)$$

where $Z_{oo}$ is the characteristic impedance of free space, and $\varepsilon_r$ is the value of the first dielectric constant.

21. The method as recited in claim 19 wherein (b) comprises selecting the second dielectric constant so that each of the plurality of islands produces a capacitor having a capacitance value $$C \geq \varepsilon_0 \varepsilon_r \left(\frac{s^2}{h}\right)$$

where $\varepsilon_o$ is the dielectric constant of air and $\varepsilon_r$ is the first dielectric constant, h is the thickness of the insulating material layer and s is a spacing between the plurality of isolated islands.

22. The method as recited in claim 19 wherein the resistive material comprises electrically conductive particles dispersed in an insulating binder in the insulating material forming the plurality of islands.

23. The method as recited in claim 19 wherein the resistive material comprises a coating on the insulating material layer.

24. The method as recited in claim 19 wherein the resistance has a value equivalent to a characteristic impedance of a unit cell in the insulating material layer.

* * * * *